United States Patent [19]

Noguchi et al.

[11] Patent Number: 4,616,344

[45] Date of Patent: Oct. 7, 1986

[54] STATIC MEMORY CIRCUIT

[75] Inventors: Eiji Noguchi, Kanagawa; Keizo Aoyama, Yamato, both of Japan

[73] Assignee: Fujitsu Limited, Kawasaki, Japan

[21] Appl. No.: 536,880

[22] Filed: Sep. 29, 1983

[30] Foreign Application Priority Data

Sep. 30, 1982 [JP] Japan ................................ 57-172152

[51] Int. Cl.$^4$ ................................................ G11C 7/00
[52] U.S. Cl. .................... 365/203; 365/189; 365/230; 365/194
[58] Field of Search ............ 365/203, 194, 190, 191, 365/195, 233, 230, 189

[56] References Cited

U.S. PATENT DOCUMENTS

| | | | |
|---|---|---|---|
| 3,866,061 | 2/1975 | Wen et al. ............................ | 365/194 |
| 4,099,265 | 12/1976 | Abe ...................................... | 365/190 |
| 4,355,377 | 10/1982 | Sud et al. ............................ | 365/203 |
| 4,417,328 | 11/1983 | Ochii .................................. | 365/203 |
| 4,447,892 | 5/1984 | Zibu ................................... | 365/203 |
| 4,499,559 | 2/1985 | Kurafuji ............................. | 365/203 |

Primary Examiner—Terrell W. Fears
Assistant Examiner—Guy M. Miller
Attorney, Agent, or Firm—Staas & Halsey

[57] ABSTRACT

A static memory circuit includes memory cells arranged in a matrix of word lines and bit lines, and a reset circuit for resetting each pair of bit lines to have an equivalent potential in response to a change in a row address signal. The reset circuit generates a reset signal at a first time a certain time period after a first change of the row address signal and terminates the reset signal at a second time when a second change of the row address signal is detected. Thus, data destruction during reading is prevented.

15 Claims, 7 Drawing Figures

STATIC MEMORY CIRCUIT

BACKGROUND OF THE INVENTION (1) Field of the Invention

The present invention relates to a static memory circuit, more particularly, to a static memory circuit which ensures high speed operation without data destruction by resetting a pair of bit lines to an equivalent potential before a change of an input address signal.

(2) Description of the Prior Art

Recently, to ensure an accurate reading operation in a memory circuit, a technique has been employed in which, before accessing a memory cell, a pair of bit lines are reset to a predetermined level, such as an intermediate level between a high (H) level and a low (L) level. This shortens the transition time of the bit-line potentials to the desired H level or the L level during a reading operation. In this technique, the bit-line potentials must be completely reset before raising the potential of the selected word line.

In a conventional static memory circuit, the reset of a bit-line potential is carried out immediately after the change of an input address signal, as described later in detail. However, improvements in high speed operation of static memory circuits have increasingly shortened the period from when the input address signal changes to when the potential of the word line rises, i.e., an output of a decoder. Because of this, the potential of the word line often rises before completion of resetting the bit-line potentials. Thus, data stored in the memory cell connected to the selected pair of bit lines is often destroyed, or the reading operation is often delayed.

SUMMARY OF THE INVENTION

An object of the present invention is to provide a static memory circuit which enables a high speed reading operation without destruction of data stored in memory cells.

To attain the above object, there is provided a static memory circuit which includes a plurality of memory cells arranged in a matrix having columns and rows; a plurality of word lines connected to respective rows of the memory cells; a plurality of pairs of bit lines connected to respective columns of the memory cells; and reset means for resetting at least one of the pairs of bit lines to have an equivalent potential, in response to a change of an input address for selecting one of the word lines. The reset means comprises a first reset signal generating circuit for generating a first reset signal. The first reset signal is generated at a first time a certain time period after a first change of the input address signal and is terminated at a second time before a second change of the input address signal. Thus, at least one of the pairs of bit lines is reset before the second change of the input address signal.

BRIEF DESCRIPTION OF THE DRAWINGS

The above object and features as well as other advantages of the present invention will be more apparent from the following description of the preferred embodiments with reference to the accompanying drawings, wherein.

DESCRIPTION OF THE PREFERRED EMBODIMENTS

Embodiments of the present invention will now be described in comparison with a conventional example and with reference to the accompanying drawings.

Figure 1:
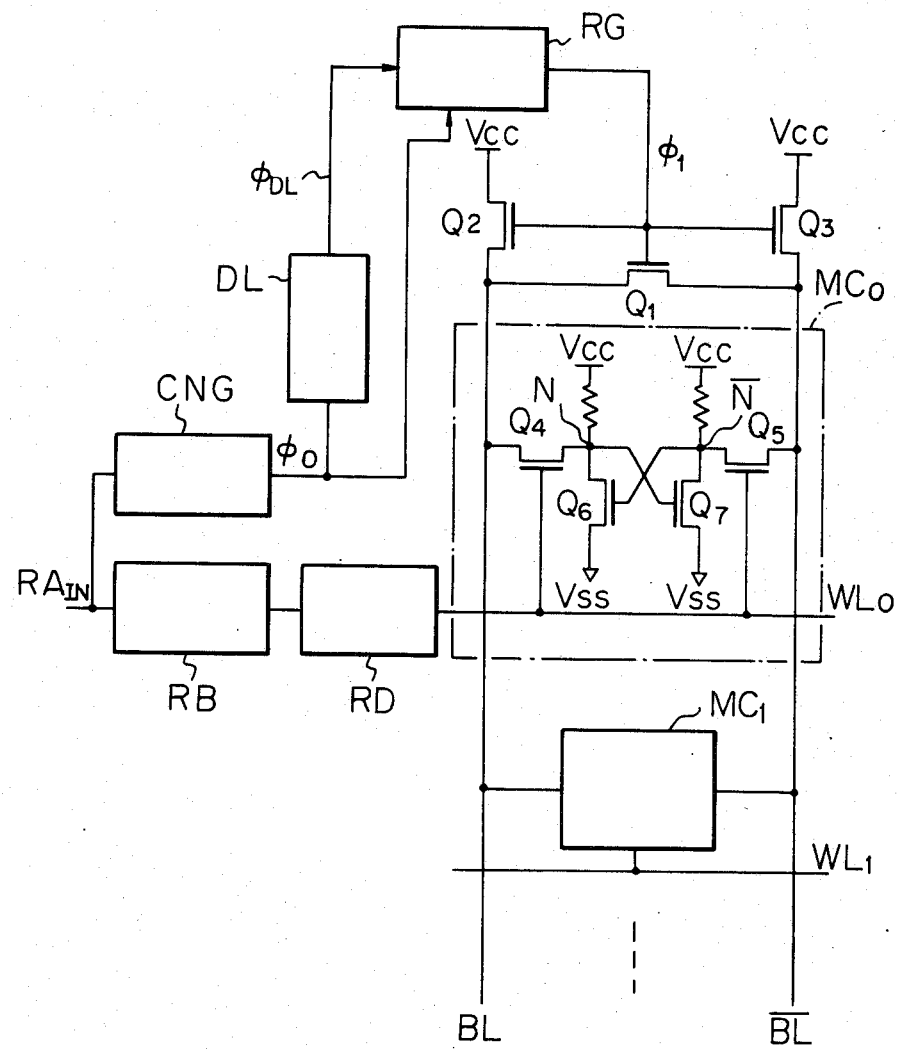
FIG. 1 is a circuit diagram of one memory cell and its peripheral circuit in a static memory circuit, according to an embodiment of the present invention.

FIG. 1 is a memory cell and its peripheral circuit in a static memory circuit according to an embodiment of the present invention. In FIG. 1, $MC_0$ is a memory cell arranged at the intersection of a pair of bit lines BL and $\overline{BL}$ and a word line $WL_0$; $MC_1$ is another memory cell arranged at an intersection of the same bit lines and a word line $WL_1$; RB is a row address buffer for receiving a row address signal $RA_{IN}$; RD is a row decoder for selecting the word line $WL_0$ in response to the row address signal $RA_{IN}$ output from the row address buffer RB; and CNG is an address-change detecting circuit for detecting a change in the potential of the row address signal to generate an address change detecting signal $\phi_0$. A delay circuit DL and a reset signal generating circuit RG are further provided in this embodiment. The delay circuit DL generates a delay signal $\phi_{DL}$ which rises at least an accessing period later than the rise of the address change detecting signal $\phi_0$ output from the address change detecting circuit CNG. The reset pulse generating circuit RG receives the delay signal $\phi_{DL}$ from the delay circuit DL and the address change detecting signal $\phi_0$ from the address change detecting circuit CNG and provides a first reset signal $\phi_1$ which rises to the H level before a change of the row address signal $RA_{IN}$.

At the ends of the pair of the bit lines BL and $\overline{BL}$, a bit line resetting transistor $Q_1$, having a source and a drain connected between the bit lines BL and $\overline{BL}$, and bit line precharging transistors $Q_2$ and $Q_3$, having a source and a drain connected between the end of the bit line BL or $\overline{BL}$ and a high voltage terminal $V_{CC}$ of a power supply, are provided. The first reset signal $\phi_1$ output from the reset signal generating circuit RG is applied to the gates of these transistors.

The memory cell $MC_0$ has two transfer gate transistors $Q_4$ and $Q_5$ and two memory storage transistors $Q_6$ an $Q_7$ cross-coupled to each other and forming a flip-flop.

While only two memory cells $MC_0$ and $MC_1$ are illustrated in FIG. 1, as is well known, in a static memory circuit, there are a number of memory cells having the same structure arranged in a matrix having columns and rows. The word lines are connected to respective rows of the memory cells. The bit lines are connected to respective columns of the memory cells.

In a conventional static memory circuit (not shown), the delay circuit DL and the reset signal generating circuit RG are not provided. Also, the address change detecting signal $\phi_0$ output from the address change detecting circuit CNG (FIG. 1) is used as a reset signal, or a signal $\phi$ which is obtained by changing the pulse width of the pulse $\phi_0$ is used as a reset signal. That is, in the prior art, all of the bit lines are reset immediately after a change of a row address signal.

Figure 2:
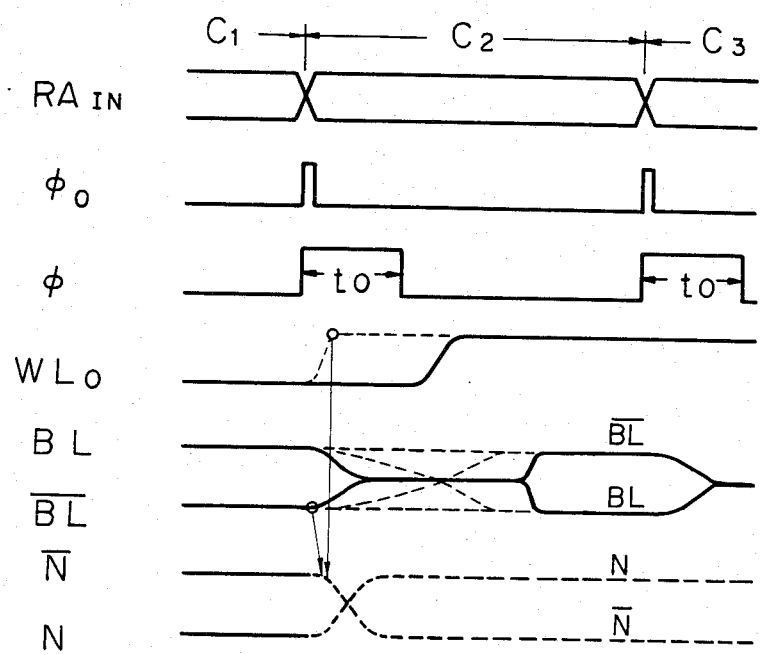
FIG. 2 is a waveform diagram for explaining a conventional reading operation and the problems therein.

The problems in the conventional static memory circuit will be described with reference to FIG. 2. As illustrated in FIG. 2, the conventional reset signal $\phi$ rises in response to the rise of the address change detecting signal $\phi_0$, which is formed in response to a change in a row address signal $RA_{IN}$, and the conventional reset signal $\phi$ falls after a period $t_0$ from its rise, the period $t_0$ being a period necessary for resetting the bit lines BL and $\overline{BL}$.

A conventional normal reading operation is first described with reference to the solid curves in FIG. 2. When the conventional reset signal $\phi$ is applied to the gates of the transistors $Q_1$, $Q_2$, and $Q_3$, these transistors are turned on, so that the bit lines BL and $\overline{BL}$ are reset to an intermediate level between the H level and the L level. After this, when the row decoder selects the word line $WL_0$ to raise its potential to the H level, the potential of one of the bit lines BL and $\overline{BL}$ changes from the intermediate level to the H level and the potential of the other of the bit lines BL and $\overline{BL}$ from the intermediate level to the L level, in accordance with the data stored in the memory cell $MC_0$. Since the potentials of the bit lines BL and $\overline{BL}$ have been reset to the intermediate level, the transitions of the potential of the bit lines BL and $\overline{BL}$ are effected within a relatively short time in comparison with the case when both of the bit lines BL and $\overline{BL}$ are precharged to the H level, i.e., the power supply voltage $V_{CC}$, and the transition of the potential of one of the bit lines must always be effected from the H level to the L level.

However, as illustrated by the broken curves in FIG. 2, problems occur when the potential of the word line $WL_0$ rises before the fall of the conventional reset signal $\phi$ or a short period after the rise of the conventional reset signal $\phi$. Assume that a memory cell, for example, $MC_1$, connected between the bit lines BL and $\overline{BL}$, other than the memory cell $MC_0$, stores data contrary to the data stored in the memory cell $MC_0$. As a result of the reading operation for the above-mentioned memory cell in a previous reading cycle $C_1$, the potential of the bit line BL is assumed to be the H level and the potential of the bit line $\overline{BL}$ is assumed to be the L level. Since the memory cell $MC_0$ is assumed to store data contrary to that in the above-mentioned memory cell read in the previous cycle $C_1$, a node N, which is a connecting point of the source of the transistor $Q_4$, the drain of the transistor $Q_6$, and the gate of the transistor $Q_7$, are at the L level, and a node $\overline{N}$, which is a connecting point of the source of the transistor $Q_5$, the drain of the transistor $Q_7$, and the gate of the transistor $Q_6$, are at the H level. In a current reading cycle $C_2$, the memory cell $MC_1$ is assumed to be accessed. If the potentials of the bit lines BL and $\overline{BL}$ have not been reset before the potential of the word line $WL_0$ rises, the potential of the bit line $\overline{BL}$ is kept at the L level, which is set during the previous reading cycle $C_1$. Therefore, charges on the node $\overline{N}$ are discharged through the transistor $Q_5$. Thus, the potential of the node $\overline{N}$ may be switched to the L level when the transistor $Q_5$ is turned on by raising the potential of the word line $WL_0$, resulting in data destruction in the memory cell $MC_0$. After the data is destroyed, the bit lines BL and $\overline{BL}$ are erroneously kept at the H level and the L level, respectively.

Even when the data in the memory cell $MC_0$ is not destroyed, a high speed reading operation cannot be effected because the bit lines BL and $\overline{BL}$ are not reset before raising the potential of the word line $WL_0$. Therefore, the rising and the falling of the bit lines BL and $\overline{BL}$ is delayed.

Recent technology has shortened the period from the change of the address input signal to the rise of the word line potential. Thus, it is difficult to reset the bit lines during the shortened period.

According to the present invention, the above-mentioned problems are resolved by generating a reset signal for the next reading cycle, before a change of a row address signal $RA_{IN}$.

Figure 3:
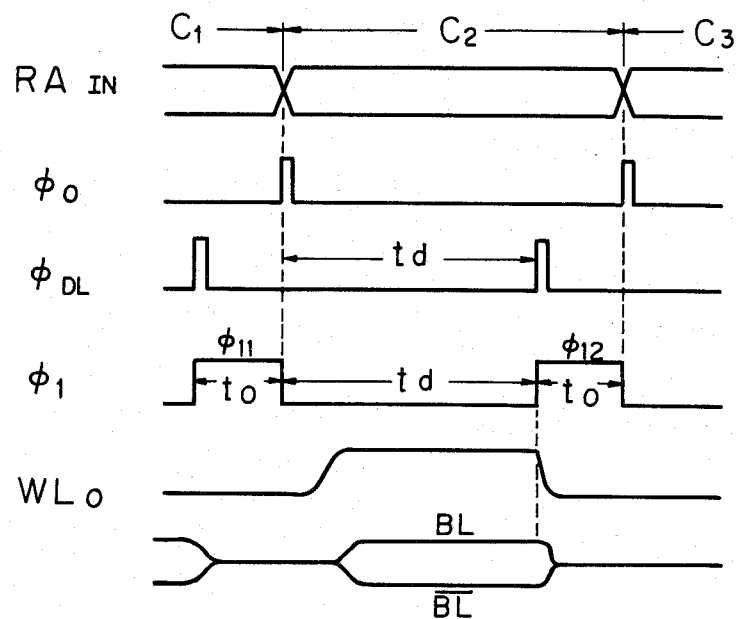
FIG. 3 is a waveform diagram for explaining the operation of the circuit of FIG. 1.

FIG. 3 is a waveform diagram for explaining the operation of the circuit of FIG. 1. In FIGS. 1 and 3, the delay circuit DL forms the delay signal $\phi_{DL}$, which is generated after a delay time $t_d$ from the generation of the address change detecting signal $\phi_0$ output from the address change detecting circuit CNG. The delay time $t_d$ is set to be longer than a period necessary for accessing a memory cell. The reset signal generating circuit RG generates the first reset signal $\phi_1$ which rises in response to the rise of the delay signal $\phi_{DL}$ and falls in response to the rise of the address change detecting signal $\phi_0$. Accordingly, the first reset signal $\phi_1$ rises after the time $t_d$ from a change of the row address signal $RA_{IN}$ and falls in response to the next change of the row address signal $RA_{IN}$. In FIG. 3, two reset signals $\phi_{11}$ and $\phi_{12}$ are illustrated. The reset signal $\phi_{11}$, which is generated at the end of the previous reading cycle $C_1$, is used for resetting the bit lines BL and $\overline{BL}$ at the intermediate level between the H level and the L level, for the purpose of carrying out a reading operation during the current reading cycle $C_2$. The reset signal $\phi_{12}$, which is generated at the end of the current reading cycle $C_2$, is used for resetting the bit lines BL and $\overline{BL}$ at the intermediate level, for the purpose of carrying out a reading operation during the next reading cycle $C_3$. Therefore, however fast the word line $WL_0$ rises in the current reading cycle $C_2$, the bit lines BL and $\overline{BL}$ have already been reset before the word line $WL_0$ rises. Accordingly, the data stored in the memory cell $MC_0$ is not destroyed and is read out to the bit lines BL and $\overline{BL}$ by rapidly changing the potential thereof to the H level or to the L level in accordance with the stored data. The data read out to the bit lines BL and $\overline{BL}$ is latched into a sense amplifier (not shown) connected thereto. After the latch of the data, the bit lines BL and $\overline{BL}$ are reset again for the next reading cycle. The latching technique itself is not the subject matter of the present invention and is described in Japanese Patent Application No. 57-50098 by the same assignee (corresponding to U.S. Ser. No. 478,722) 3/25/83.

The duration of the first reset pulse $\phi_1$ is determined so as to sufficiently reset the bit lines BL and $\overline{BL}$.

The delay circuit DL may be constructed by a plurality of inverters connected in series to generate the delay signal $\phi_{DL}$ or may be constructed by a dummy circuit which operates with the same timing clocks as those of the circuit in the static memory circuit.

The structure of the address change detecting circuit CNG is also disclosed in the aforementioned Japanese Patent Application No. 57-50098.

Figure 4:
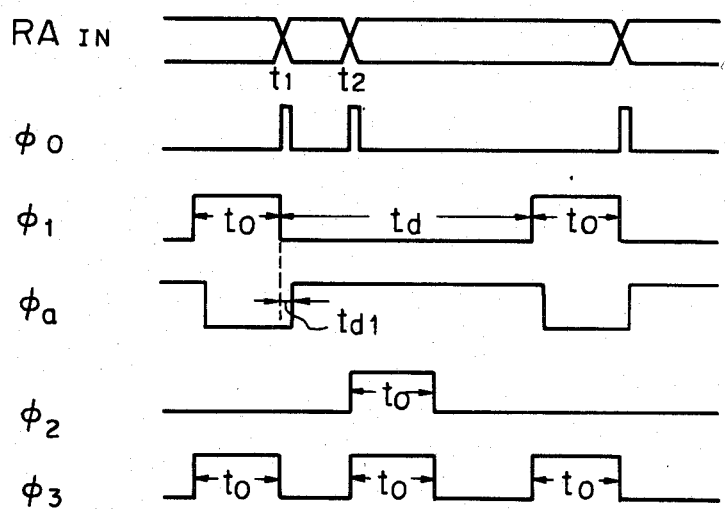
FIG. 4 is a waveform diagram for explaining a second embodiment according to the present invention.

A second embodiment of the present invention will now be described with reference to FIGS. 4 and 5. As shown in FIG. 4, there is a possibility that, shortly after a change of the row address signal RA$_{IN}$ at a time t$_1$, the row address signal RA$_{IN}$ again changes at a time t$_2$. The time t$_2$ is later than the time t$_1$ but the period between the times t$_1$ and t$_2$ is shorter than the delay time t$_d$. In this case, the circuit of FIG. 1 cannot generate the first reset signal $\phi_1$ between the times t$_1$ and t$_2$. Such a possibility of two or more changes of the row address signals within a period shorter than the minimum accessing period may occur when, for example, the row address signals of two rows are generated at slightly different timings.

To reset the bit line potential in response to such an abnormal change of the row address signal, as mentioned above, additional signals $\phi_a$, $\phi_2$, and $\phi_3$ are generated in the second embodiment.

Figure 5:
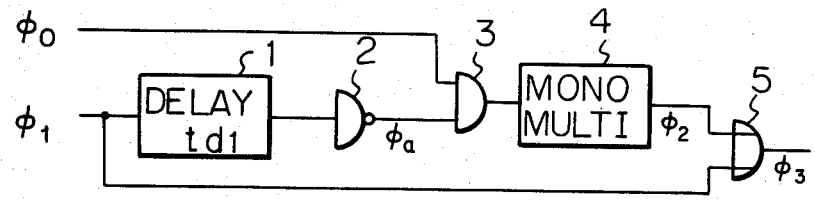
FIG. 5 is a circuit diagram of a logic circuit for forming the second reset signal shown in FIG. 4, according to the second embodiment of the present invention.

These signals are generated in a logic circuit shown in FIG. 5. Referring to FIGS. 4 and 5, a delay circuit 1 delays the first reset signal $\phi_1$ by a small delay period t$_{d1}$. An inverter 2 inverts the output of the delay circuit 1 to provide the inverted signal $\phi_a$. The address change detecting signal $\phi_0$ and the inverted signal $\phi_a$ are input to an AND gate 3. A monostable multivibrator 4 receives the output of the AND gate 3 and outputs a second reset pulse $\phi_2$ which has the time duration t$_0$ sufficient for resetting the bit lines BL and $\overline{BL}$. The first reset signal $\phi_1$ and the second reset signal $\phi_2$ are input to an OR gate 5. At the output of the OR gate 5, a third reset signal $\phi_3$ including the first reset signal $\phi_1$ and the second reset signal $\phi_2$ is obtained.

The third reset signal $\phi_3$ is applied to the gates of the transistors Q$_1$, Q$_2$, and Q$_3$. Thus, a reset signal is generated not only for a normal address change which occurs after a sufficiently long period of time for accessing a memory cell after the previous address change, but also for an abnormal address change which occurs immediately after the previous address change as shown in FIG. 4.

The second reset signal $\phi_2$ is generated immediately after the abnormal address change at the time t$_2$ in the same way as the conventional reset signal $\phi$ (FIG. 2) is generated. Therefore, the same problems may arise for the second reset signal $\phi_2$. However, in most cases in a static memory circuit, for such an abnormal address change which occurs within a period shorter than the delay time t$_d$, the time necessary for accessing a memory cell is set to be longer than that for a normal address change. When the accessing time for an abnormal address change is set to be so long, the potential of the word line rises slowly, so that no data destruction occurs.

As a result, according to the second embodiment shown in FIGS. 4 and 5, the effect of the first embodiment is also obtained for normal address changes which occur a long period of time after the previous address changes. For abnormal address changes which occur in a period of time shorter than the accessing period after the previous address changes, the bit lines are reset in the same way as conventional methods.

A third embodiment of the present invention is described with reference to FIGS. 1, 6, and 7.

In the circuit of FIG. 1, there is a possibility that the writing characteristic may be deteriorated or a writing operation cannot be carried out while the reset signal is the H level. This problem is resolved in the third embodiment. As shown in FIG. 6, the first reset signal $\phi_1$ is inhibited while a write enable signal $\overline{WE}$ is the H level, i.e., during a writing operation. To inhibit the first reset signal $\phi_1$, as shown in FIG. 7, a fourth reset signal $\phi_4$ is obtained by gating the first reset signal $\phi_1$ and the write enable signal $\overline{WE}$ through an AND gate 6. The fourth reset signal $\phi_4$ is applied to the gates of the transistors Q$_1$, Q$_2$, and Q$_3$ in FIG. 1. Thus, the detrimental influence of the reset signal on the writing characteristic can be prevented.

It is clear that, instead of the first reset signal $\phi_1$, the second reset signal $\phi_2$ may alternatively be applied to the AND gate 6.

Figure 6:
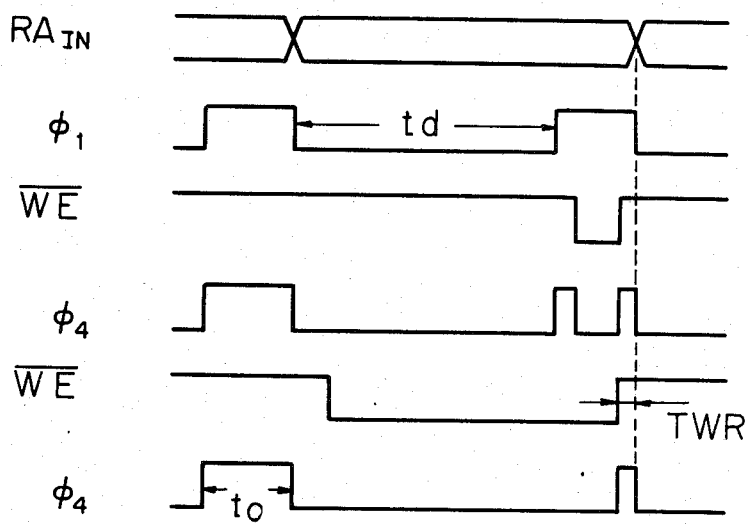
FIG. 6 is a waveform diagram for explaining a third embodiment according to the present invention.
Figure 7:
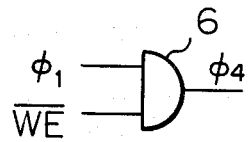
FIG. 7 is a circuit diagram of a logic circuit for forming a third reset signal shown in FIG. 6, according to the third embodiment of the present invention.

If, however, as illustrated in FIG. 6, the width of the L level of the write enable signal $\overline{WE}$ during one active cycle is longer than the delay time t$_d$, the width of the fourth reset signal $\phi_4$ is narrower than the duration t$_0$. However, in a static memory circuit, the width of the H level of the write enable signal $\overline{WE}$ immediately before a change of an address signal is generally set to be a value greater than a predetermined value TWR. Therefore, the width of the fourth reset signal $\phi_4$ is at least TWR.

As was described, according to the present invention, by generating a reset signal for a next active cycle before changing an address signal for the next active cycle, bit lines in a static memory circuit are reliably reset, however fast the word line rises after the change of the address signal, during the next active cycle. This results in a high speed reading operation without destruction of data stored in memory cells.

We claim:

1. A static memory circuit operatively connected to receive an input address signal, comprising:
    a plurality of memory cells arranged in a matrix having columns and rows;
    a plurality of word lines, operatively connected to receive the input address signal, for selecting one of said word lines and operatively connected to respective rows of said memory cells;
    a plurality of pairs of bit lines operatively connected to respective columns of said memory cells; and
    reset means, operatively connected to said pairs of bit lines, for resetting at least one of each of said pairs of bit lines to an intermediate level between a high level potential and a low level potential of the bit lines, in response to a change of the input address signal for selecting one of said word lines,
    said reset means comprising a first reset signal generating circuit, operatively connected to one of said pairs of bit lines, for generating a first reset signal at a first time after a read/write operation period during each cycle between a first change in the input address signal and a second change in the input address signal, whereby said at least one of each of said pairs of bit lines is reset after the read/write operation.

2. A static memory circuit as set forth in claim 1, wherein said certain time period is determined to be longer than a period necessary for accessing one of said memory cells.

3. A static memory circuit as set forth in claim 1, operatively connected to receive a row address signal, wherein said reset means further comprises:
    an address change detecting circuit for detecting a change in the potential of the row address signal and providing an address change detecting signal, the row address signal being a signal for selecting one of said rows; and
    a first delay circuit, operatively connected to said address change detecting circuit, for receiving the address change detecting signal and providing a delay signal generated at the first time, said first reset signal generating circuit generating said first reset signal in response to the delay signal after the first change in the input address signal and terminating said first reset signal in response to the address change detecting signal when the second change in the input address signal is detected.

4. A static memory circuit as set forth in claim 3, wherein said reset means further comprises a bit line resetting transistor having a gate and having a source and a drain connected between each one of said pairs of bit lines, said first reset signal being applied to the gate of said bit line resetting transistor.

5. A static memory circuit as set forth in claim 4, operatively connectable to a power supply, wherein said reset means further comprises bit line precharging transistors each having a gate and each having a drain and a source connected between an end of one of said bit lines of one of each of said pairs of bit lines and a high voltage terminal of the power supply, said first reset signal being applied to the gates of said bit line precharging transistors.

6. A static memory circuit operatively connected to receive an input address signal and a row address signal, comprising:
a plurality of memory cells arranged in a matrix having columns and rows;
a plurality of word lines, operatively connected to receive the input address signal, for selecting one of said word lines and operatively connected to respective rows of said memory cells;
a plurality of pairs of bit lines operatively connected to respective columns of said memory cells; and
reset means, operatively connected to said pairs of bit lines, for resetting at least one of said pairs of bit lines to an intermediate level between a high level potential and a low level potential of said bit lines, in response to a change of the input address signal for selecting one of said word lines, said reset means comprising:
a first reset signal generating circuit, operatively connected to one of said pairs of bit lines, for generating a first reset signal at a first time after a read/write operation period in each cycle between a first change in the input address signal and a second change in the input address signal, whereby said at least one of each of said pairs of bit lines is reset after the read/write operation;
an address change detecting circuit for detecting a change in the potential of the row address signal and providing an address change detecting signal, the row address signal being a signal for selecting one of said rows;
a delay circuit, operatively connected to said address change detecting circuit, for receiving the address change detecting signal and providing a delay signal generated at the first time, said first reset signal generating circuit generating said first reset signal in response to the delay signal after the first change in the input address signal and terminating said first reset signal in response to the address change detecting signal when the second change in the input address signal is detected; and
a second reset signal generating circuit, operatively connected to receive the address change detecting signal and the first reset signal, for generating a second reset signal in response to a change of the input address signal when said first reset signal is terminated, said second reset signal being applied to reset said pairs of bit lines.

7. A static memory circuit as set forth in claim 6, wherein said second reset signal generating circuit comprises:
a second delay circuit, operatively connected to said first reset signal generating circuit, for delaying said first reset signal and providing an output signal;
an inverter, operatively connected to said second delay circuit, for providing an inverted signal of the output signal from said second delay circuit;
an AND gate, operatively connected to said inverter and said address change detecting circuit, for providing a logical product of said inverted signal and said address change detecting signal; and
a monostable multivibrator, operatively connected to said AND gate, for receiving said logical product and providing said second reset signal.

8. A static memory circuit as set forth in claim 7, wherein said reset means further comprises a bit line resetting transistor, operatively connected to one of said pairs of bit lines and said second reset signal generating circuit, having a gate and having a source and drain connected between each of said bit lines of one of said pairs of bit lines, said second reset signal being applied to the gate of said bit line resetting transistor.

9. A static memory circuit as set forth in claim 8, operatively connectable to a power supply, wherein said reset means further comprises bit line precharging transistors each having a gate, and having a drain and a source connected between an end of each of said bit lines of one of said pairs of bit lines and a high voltage terminal of the power supply, said second reset signal being applied to the gates of said bit line precharging transistors.

10. A static memory circuit as set forth in claim 3, operatively connected to receive a write enable signal, wherein said reset means further comprises an AND gate, operatively connected to said first reset signal generating circuit, for receiving said first reset signal and the write enable signal and providing a logical product thereof, said logical product being a second reset signal.

11. A static memory circuit as set forth in claim 10, wherein said reset means further comprises a bit line resetting transistor, operatively connected to one of each of said pairs of bit lines, having a gate and having a source and a drain connected between each of said bit lines of one of said pairs of bit lines, said second reset signal being applied to the gate of said bit line resetting transistor.

12. A static memory circuit as set forth in claim 11, operatively connectable to a power supply, wherein said reset means further comprises bit line precharging transistors each having a gate and each having a drain and source connected between an end of each of said bit lines of one of said pairs of bit lines and the high voltage terminal of the power supply, said second reset signal being applied to the gates of said bit line precharing transistors.

13. A static memory circuit as set forth in claim 6, operatively connected to receive a write enable signal, wherein said reset means further comprises an AND gate, operatively connected to said second reset signal generating circuit, for receiving said second reset signal and the write enable signal and providing a logical product thereof, said logical product being a third reset signal.

14. A static memory circuit as set forth in claim 13, wherein said reset means further comprises a bit line resetting transistor having a gate and having a source and drain connected between each of said bit lines of one of said pairs of bit lines, said third reset signal being applied to the gate of said bit line resetting transistor.

15. A static memory circuit as set forth in claim 14, operatively connectable to a power supply, wherein said reset means further comprises bit line precharging transistors each having a gate and each having a drain and source connected between an end of each of said bit lines of one of said pairs of bit lines and the high voltage terminal of the power supply, said third reset signal being applied to the gates of said bit line precharging transistors.

* * * * *

UNITED STATES PATENT AND TRADEMARK OFFICE
CERTIFICATE OF CORRECTION

PATENT NO.  : 4,616,344
DATED       : OCTOBER 7, 1986
INVENTOR(S) : EIJI NOGUCHI ET AL.

It is certified that error appears in the above-identified patent and that said Letters Patent is hereby corrected as shown below:

Col. 4, line 56, delete "3/25/83".

Col. 6, line 38, "plurlaity" should be --plurality--.

Col. 8, line 62, "precharing" should be --precharging--.

Signed and Sealed this

Sixth Day of January, 1987

Attest:

DONALD J. QUIGG

Attesting Officer

Commissioner of Patents and Trademarks